United States Patent
Shimokohbe et al.

(10) Patent No.: US 7,026,696 B2
(45) Date of Patent: *Apr. 11, 2006

(54) THIN FILM-STRUCTURE AND A METHOD FOR PRODUCING THE SAME

(75) Inventors: Akira Shimokohbe, Machida (JP); Seiichi Hata, Machida (JP)

(73) Assignee: Tokyo Institute of Technology, Tokyo (JP)

( * ) Notice: Subject to any disclaimer, the term of this patent is extended or adjusted under 35 U.S.C. 154(b) by 12 days.

This patent is subject to a terminal disclaimer.

(21) Appl. No.: 10/788,333

(22) Filed: Mar. 1, 2004

(65) Prior Publication Data

US 2004/0166330 A1 Aug. 26, 2004

Related U.S. Application Data

(63) Continuation of application No. 09/556,795, filed on Apr. 25, 2000, now Pat. No. 6,759,261.

(30) Foreign Application Priority Data

May 7, 1999 (JP) ................................. 11-126680

(51) Int. Cl.
  *H01L 29/82* (2006.01)
(52) U.S. Cl. .................................................... 257/415
(58) Field of Classification Search ................ 438/48, 438/50, 52; 257/415
  See application file for complete search history.

(56) References Cited

U.S. PATENT DOCUMENTS

| | | | |
|---|---|---|---|
| 4,285,730 A * | 8/1981 | Sanford et al. ................ | 501/44 |
| 4,405,710 A * | 9/1983 | Balasubramanyam et al. ........................... | 430/311 |
| 5,827,343 A | 10/1998 | Engelke et al. | |
| 5,950,704 A | 9/1999 | Johnson et al. | |
| 5,994,159 A | 11/1999 | Aksyuk et al. | |
| 6,759,261 B1 * | 7/2004 | Shimokohbe et al. ......... | 438/48 |

FOREIGN PATENT DOCUMENTS

| EP | 0 762176 A2 | 3/1997 |
|---|---|---|
| EP | 0 783108 A1 | 7/1997 |
| JP | A-9-126833 | 5/1997 |
| JP | A-9-237906 | 9/1997 |
| JP | A-9234630 | 9/1997 |
| JP | A-11-58244 | 3/1999 |

OTHER PUBLICATIONS

Barsoum, "Fundamentals of Ceramics", Chapter 9, p 311-317, McGraw-Hill Companies, Inc., (1997).

Busch et al., Appl. Phys. Lett., vol. 72(21), p 2695-2697, (1998).

(Continued)

*Primary Examiner*—Asok Kumar Sarkar
(74) *Attorney, Agent, or Firm*—Oliff & Berridge, PLC

(57) ABSTRACT

A thin film made of an amorphous material having a supercooled liquid phase region is formed on a substrate. Then, the thin film is heated to a temperature within the supercooled liquid phase region and is deformed by its weight, mechanical external force, electrostatic external force or the like, thereby to form a thin film-structure. Thereafter, the thin film-structure is cooled down to room temperature, which results in the prevention of the thin film's deformation.

5 Claims, 16 Drawing Sheets

OTHER PUBLICATIONS

Saotome et al., "Suparplastic Micro-forming of Microstructures", Proceedings, IEEE Workshop on Micro Electro Mechanical Systems, p 343-348, 1994.

Inoue et al., "Al-La-Ni Amorphous Alloys With a Wide Supercooled Liquid Region", Materials Transactions, JIM, vol. 30, p 965-972 (1989).

Saotome et al., "Microforming of MEMS parts with Amorphous Alloy", Materials Research Symposium (Meeting Date: Dec. 1998)—proceedings, vol. 554 (1999).

Inoue et al., Micro-Forming of Amorphous Alloys. Amorphous Micro-Gear Forming, Kinzoku vol. 63(3), p51-57 (1993).

* cited by examiner

Before heating

After heating

THIN FILM-STRUCTURE AND A METHOD FOR PRODUCING THE SAME

This is a Divisional of application Ser. No. 09/556,795 filed Apr. 25, 2000, now U.S. Pat. No. 6,759,261. The entire disclosure of the prior application is hereby incorporated by reference herein in its entirety.

BACKGROUND OF THE INVENTION

1. Field of the Invention

This invention relates a thin film-structure and a method for producing the same, and more particularly the same structure and the same method suitable for parts constituting micro machines such as a micro actuator, cats, various sensors such as a micro sensor, various probes such as a sensor for a scanning probe-microscope, etc.

2. Description of the Prior Art

Micro machines, various sensors, various probes, etc. are needed to detect outward powers from a substrate surface, various proximity effects in a substrate surface, flows of liquids, voltages of other electronic circuits. Thus, thin film-structures, made by three-dimensionally deforming plane structures such as beams composed of various thin films through applied micro machining of thin film-forming techniques and micro processing techniques in manufacturing semiconductors, have been used.

In the past, a thin film-structure was produced as follows:

(1) A plane structure composed of two kind and over layers with different thermal expansion coefficients is formed and the three-dimensional thin film-structure was produced from the plane structure through its bimorph effect.

(2) A plane structure made of polysilicon is heated and deformed through current heating, maintained by a micro probe, to produce the three-dimensional thin film-structure.

(3) A thin film is formed by sputtering or the like and the three-dimensional thin film-structure is produced from the thin film by taking advantage of the remaining stresses in the film formation.

In producing the thin film structure by taking advantage of the above bimorph effect (the above (1)), the thin film structure has had layers with different thermal expansion coefficient after its production. Thus, on account of temperature change in using, the shape of the thin film structure changes with time through the bimorph effect in nearby room temperature.

In producing the thin film structure by heating and deforming the polysilicon (the above (2)), the thin film structure has difficulty having a desired strength and elastic limit, etc. because a material for it is limited to the polysilicon. Moreover, the plane structure requires to be held by a microprobe, which results in degradation of its productivity.

In producing the thin film structure by taking advantage of the remaining stresses in film-forming (the above (3)), its reproducibility is degraded and its shape change with time due to the change with time of the remaining stresses.

SUMMERY OF THE INVENTION

It is an object of the present invention to provide a thin film-structure having good productivity, reproducibility and good shape-stability after its production and a method for producing the same.

This invention relates to a thin film-structure composed of a three-dimensional deformed thin film made of an amorphous material having an supercooled liquid phase region.

This invention also relates to a method for producing a thin film-structure comprising the steps of:

forming on a substrate a thin film made of an amorphous material having an supercooled liquid phase region, heating the thin film to a temperature within the supercooled liquid phase region and thereby deforming the thin film in a given shape, and cooling the thin film to room temperature from the temperature within the supercooled liquid phase region to stop deforming the thin film and thereby forming the thin film-structure.

To iron out the above problems, this inventors has been intensely studied to develop a new material constituting the thin film-structure and a method for producing it. At last, they have found a way to solve the above problems as follows:

The thin film-structure is formed of an amorphous material having an supercooled liquid phase region. First of all, a thin film is formed of the amorphous material and is heated to a temperature within the supercooled liquid phase region. Then, the thin film is deformed to a given shape at the temperature with the supercooled liquid phase region.

That is, when the thin film made of the amorphous material having the supercooled liquid phase region is heated, it exhibits glass-transition phenomenon. Just then, the once solid and high rigid thin film becomes semisolid (supercooled liquid) and becomes in viscous flow of a viscosity of $10^8$–$10^{13}$ Pa·S. Thus, the thin film can be deformed through its weight as well as force from outside. Moreover, the thin film become soft at the region, so that it can be easily deformed to every kind of shape desired.

Then, when the thin film is cooled to a temperature below the super-cooled liquid phase region, it becomes solid again and exhibits large stiffness. Thus, the thin film formed in a desired shape at the temperature within the region becomes solid and has large stiffness with its shape being maintained.

This invention has been realized through this inventors' finding and attention of the above natures of the amorphous material having the supercooled liquid phase region and taking advantage of the natures.

According to the thin film-structure and the method for producing the same, only when the thin film made of the amorphous material is heated to a temperature within the supercooled liquid phase region, the thin film becomes in a viscous flow. Thus, the thin film can be easily deformed to form the thin film-structure. Since the thin film has a very large stiffness in a normal use nearby room temperature, the thin film dose not almost change in its shape.

Consequently, the thin film-structure having a high productivity, reproducibility and good shape-stability after its production can be provided.

Herein, the wording "supercooled liquid phase region" is a temperature region from a glass-transition temperature (Tg) to a crystallization-starting temperature (Tx).

BRIEF DESCRIPTION OF THE DRAWINGS

The invention will be more particularly described with reference to the accompanying drawings.

DESCRIPTION OF THE PREFERRED EMBODIMENTS

Figure 1:
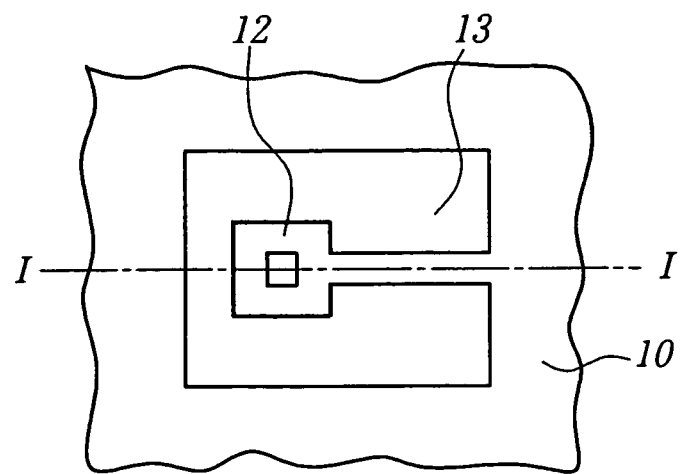
FIG. 1 is a plan view showing a first step in an embodiment of the method for producing the thin film-structure according to the present invention.

The invention will be described in detail as follows, with reference to the above drawings.

The thin film-structure requires to be made of an amorphous material having an supercooled liquid phase region.

The amorphous material is not restricted if it can achieve the above object of the present invention. As the amorphous material is exemplified an oxidic glass ($SiO_2$, Pyrex glass, etc.) or a metallic glass made of a chalcogenide semiconductor (As—S, Si—As—Te, etc.), some amorphous alloy (Zr—Cu—Al, Pd—Cu—Si, etc.) or the like.

The amorphous material preferably has a glass-transition temperature of 200–600° C. in its supercooled liquid phase region, more preferably 250–400° C. The lower glass-transition temperature of the amorphous material enables the heating step of the thin film made of it to be simplified. Moreover, it can vary materials of a substrate on which the thin film is formed and of a jig to hold a substrate. Generally, the amorphous material has viscosity of $10^{11}$–$10^{13}$ Pa·S at nearby its glass-transition temperature. Therefore, the thin film made of the above amorphous material is prevented from being deformed excessively and being destroyed due to its large deformation during short time as its viscosity falls down too low.

The amorphous material has a very large stiffness at nearby room temperature. Thus, the thin film deformed in the supercooled liquid phase region does not almost change its shape in use. Consequently, the thin film-structure having an excellent shape-stability can be provided.

The supercooled liquid phase region preferably has a temperature width more than 20° C. The relatively large temperature width enables the heating step of the thin film to be simplified. Moreover, it can reduce influence due to the temperature fluctuation in the heating.

Concretely, $Zr_{66}Cu_{39}Al$, $Pd_{76}Cu_6Si_{18}$, boron oxide etc. are exemplified as the amorphous material.

The thin film-structure of the present invention requires to be produced by heating the thin film made of like the above amorphous material to a temperature within its supercooled liquid phase region. The heating of the thin film may be carried out by a well known means such as infrared heating, inductive heating, resistive heating.

Besides, the thin film-structure of the present invention requires to be produced by deforming the thin film into a given shape with the thin film being maintained at a temperature within the supercooled liquid phase region after the thin film is heated to the above temperature.

The deforming of the thin film may be carried out by applying mechanical external force, electrostatic external force, magnetic external force for the thin film or taking advantage of the bimorph effect or the weight of the thin film.

Each method is explained hereinafter.

(A Method to Deform the Thin Film Through its Weight)

Normally, the above thin film having dimension of μm order does not almost change in its shape. However, when it is heated to a temperature within its supercooled liquid phase region, it easily change in its shape through its weight. Moreover, the thin film does not become in a viscous flow at a temperature below the region, it does not almost change. Thus, the deformation degree of the thin film depends upon its viscosity and its heat-holding time in the region. That is, as the viscosity is small and the heat-holding time is long, the deformation degree rises up.

Furthermore, the thin film may be processed in beam-like shape by etching or the like it, and a wide portion or a bump-like protuberance may be formed on the tip of the thin film. It can increase the weight of the tip and thereby increase the deformation degree of the thin film.

(A Method to Deform the Thin Film Through Mechanical External Force)

In this case, the thin film is deformed by applying external force for it by using a micro pin before heating it to a temperature within its supercooled liquid phase region, and during the heating, the external force is maintained. When the thin film is heated to the temperature on that condition, it softens and generates permanent strain therein to relax its stress due to the external force. The permanent strain corresponds to the deformation degrees of the thin film.

In using an appropriate micro pin-driving machine such as a micro manipulator, the thin film may be directly deformed during the heat-holding through the micro pin attached to the machine after it heated to the temperature of the supercooled liquid phase region.

(A Method to Deform the Thin Film Through Electrostatic External Force)

If the thin film is made of a conductive amorphous material having an supercooled liquid phase region such as $Zr_{66}Cu_{33}Al$, an opposite electrode having an insulated layer is formed opposing to the thin film. Then, an external power supply is connected between the thin film and the opposite electrode and the voltage from the power supply is supplied therebetween. Just then, an electrostatic field is generated and electrostatic force is generated therebetween. The thin film in viscous flow, heated to a temperature within its supercooled liquid phase region, is easily deformed into a given shape by the attraction or repulsion of the electrostatic force.

If the thin film is made of a nonconductor such as an oxidic glass, an electrode layer made of conductive material such as Au is formed nearby the thin film by a well known film-forming method such as sputtering. Then, an outer power supply is connected between the electrode layer and the opposite electrode and the voltage from the power supply is supplied therebetween. Consequently, the thin film maintained in the supercooled liquid phase region is deformed through the electrostatic force generated therebetween as above-mentioned.

The deformation degree of the thin film can be controlled by adjusting the gap between the thin film and the opposite electrode, the supplied voltage, the heating temperature and the heating time.

The electrostatic force may be generated before or after heating the thin film.

(A Method to Deform the Thin Film Through Magnetic External Force)

If the thin film is deformed through magnetic external force, a magnetic layer is formed nearby the thin film. Then, an opposite magnet such as a permanent magnet or an electromagnet is installed in opposition to the magnetic layer. The thin film is deformed through the attraction or the repulsion of the magnetic force generated between the magnetic layer and the opposite magnet.

If the thin film is deformed through such a magnetic external force, the magnetic material of which the magnetic layer is made requires to have a larger Curie temperature than the glass-transition temperature of the thin film having an supercooled liquid phase region. Thereby, when the thin film is heated to a temperature within its supercooled liquid phase region, the magnetic layer can maintain its magnetism, so that the thin film can be deformed.

The deformation degree of the thin film can be controlled by adjusting the gap between the thin film and the above magnetic, the magnetic flux, the heating temperature, or the heating time.

In this method, the magnetic material constituting the magnetic layer preferably has a Curie temperature within 210–1200° C., more preferably 350–1150° C. Thereby, when the thin film is heated to the temperature with the supercooled liquid phase region, it can be easily deformed into a given shape through only the magnetic external force determined by the gap or the magnetic flux since it has a sufficiently large magnetization.

Fe, Ni, Co, $Ni_3Fe$, etc. may be preferably used as the magnetic material.

(A Method to Deform the Thin Film Through its Bimorph Effect)

For deforming the thin film through its bimorph effect, a subsidiary layer having a difficult thermal expansion coefficient or internal stress from the thin film is formed nearby the thin film. When the thin film is heated to a temperature within its supercooled liquid phase region, a stress occurs at the interface between the thin film and the subsidiary layer. Just then, the thin film is deformed through the stress.

Concretely, the subsidiary layer nearby the thin film may be formed directly of a material having a different thermal expansion coefficient from the thin film. Moreover, it may be composed of an internal stress-layer formed by adjusting film-forming conditions such as a pressure of sputtering atmosphere or a mixed layer of the materials of a substrate and the thin film.

In the former, the material of the subsidiary layer is requires to have a thermal resistance to stand the heating to a temperature within the supercooled liquid phase region of the amorphous material of the thin film. Concretely, the material preferably has a thermal expansion coefficient of not more than $5 \times 10^{-6}$ or $15 \times 10^{-6}$–$40 \times 10^{-6}$ at a temperature over 200° C. As the material, $SiO_2$, $Si_3N_4$, Cr, Ni, Al are exemplified.

The internal stress-layer preferably has an compressive or tensile stress of which absolute value is 1 MPa to 3 GPa, more preferably 10 MPa to 100 MPa. It may be composed of a Cr-layer formed by DC sputtering under an Ar atmosphere-pressure of 0.3 Pa and a sputtering voltage of 500V.

In this case, if the subsidiary layer is formed too thick, the shape of the thin film-structure often change with time due to its bimorph effect near room temperature, as above-mentioned. Thus, the subsidiary is preferably thinner. The thickness of the subsidiary layer is determined depending upon Young's modulus of itself and the thin film. If both have similar Young's modulus, the subsidiary layer preferably has a thickness of not more than one-hundredth of the thin film, more preferably has a thickness of 10–200 nm.

Moreover, if there is a difference in etching resistance between the subsidiary layer and the thin film having its supercooled liquid phase region, the subsidiary layer may be removed through an etchant not to etch the thin film and the substrate. Thereby, the shape of the thin film-structure does not change with time since its bimorph effect near room temperature is prevented.

The mixed layer constituting the subsidiary layer may be formed as follows:

First of all, the substrate is counter-sputtered by controlling sputtering conditions such as an atmosphere pressure and a sputtering output power during forming process of the thin film through sputtering. Just then, particles constituting the substrate are incorporated into the thin film to form the mixed layer.

In this case, too, if the mixed layer is formed too thick for the thin film, the shape of the thin film-structure often change with time through its bimorph effect near room temperature. Thus, the thickness of the mixed layer is preferably restricted within a given value, as above-mentioned.

In thin method, the deformation degree of the thin film is determined by the Young's modulus, the thickness, and a difference in thermal expansion coefficients of the thin film and the subsidiary layer, the heating temperature and heating time.

After the thin film is deformed to form the thin film-structure, it is cooled down to room temperature by voluntary cooling such as heat emission, introducing a cooling gas, contacting with a cooling board or the like. In deforming through the magnetic external force, the thin film may be cooled down by contacting with water-cooled electromagnet.

The thin film may be formed of an amorphous material having an supercooled liquid phase region by a sputtering method, a physical vapor deposition method such as a vacuum vapor deposition, a chemical vapor deposition method such as a CVD method.

The thin film constituting the thin film-structure of the present invention is not limited in its thickness, but may have any thickness depending upon the use of the thin film-structure. However, in applying the thin film-structure for various sensors or various probes, the thin film has a thickness of 1–20 μm, generally.

The thin film may be processed by wet-etching, dry-etching, lift-off, etc. to form a plane structure having a desired shape, in accordance with the use of the thin film-structure.

EXAMPLES

This invention is concretely described on the examples, with reference to the drawings.

EXAMPLE 1

In this example, the thin film made of an amorphous material having an supercooled liquid phase region was deformed through its weight.

FIGS. 1–5 are process charts showing a producing process of the thin film-structure of thin example.

Figure 2:
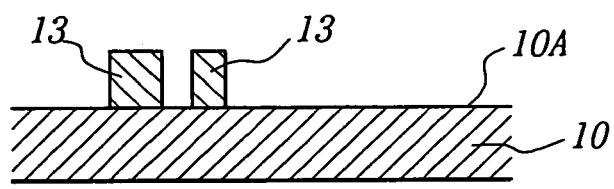
FIG. 2 is a cross sectional view taken on line I—I of FIG. 1.
Figure 3:
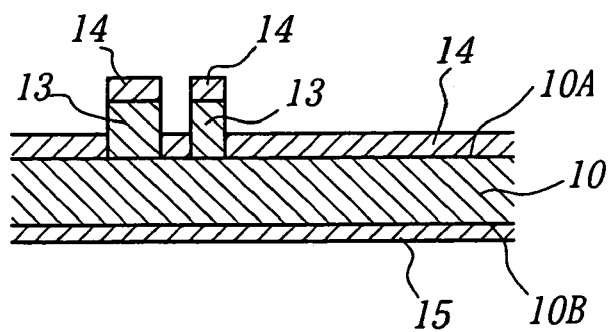
FIG. 3 is a cross sectional view showing a step after the step of FIGS. 1 and 2.
Figure 4:
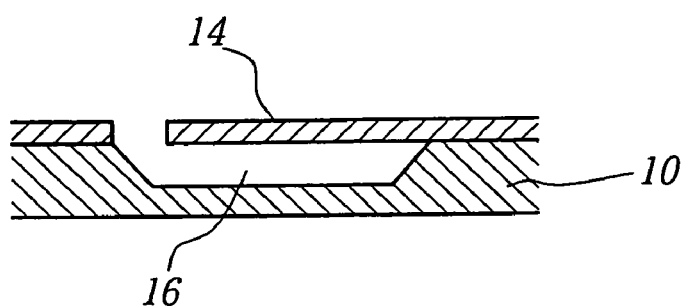
FIG. 4 is a cross sectional view showing a step after the step of FIG. 3.
Figure 5:
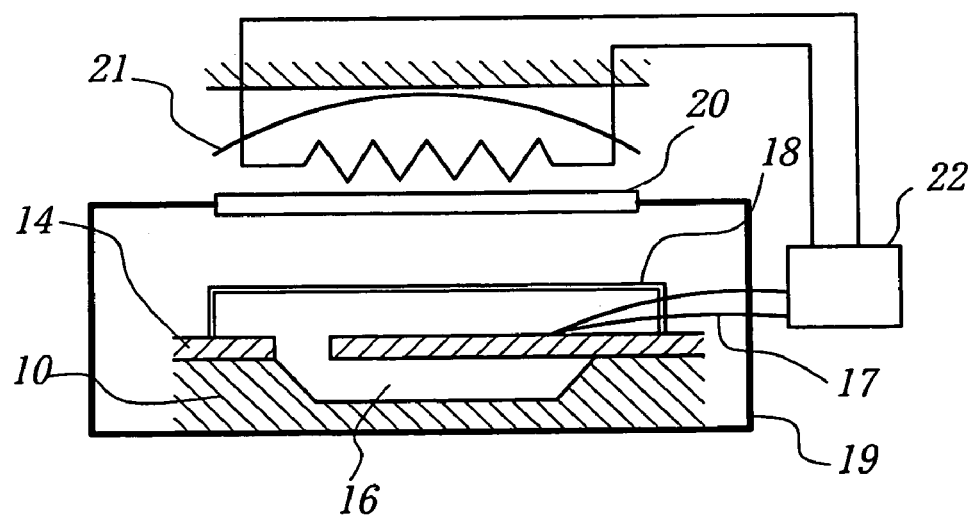
FIG. 5 is a cross sectional view showing a step after the step of FIG. 4.

FIG. 1 is a plan view showing a first step in the producing method of the thin film-structure, and FIG. 2 is a cross sectional view taken on line I—I of FIG. 1. FIGS. 3–5 are cross sectional views showing steps after the step of FIGS. 1 and 2 with time.

A substrate 10 was composed of a single crystalline silicon wafer having a thickness of 200 μm and a crystal orientation <100>.

First of all, as shown in FIGS. 1 and 2, a polyimide film was formed in a thickness of 5 μm, by a spin coat method, on a main surface 10A of the substrate 10, and an one side-fixed beam-like negative pattern 13 having a paddle 12 was formed by reactive ion etching (RIE). Then, as shown in FIG. 3, a thin film 14 made of a $Zr_{66}Cu_{33}Al$ metallic glass was formed in a thickness of 2 μm, by a sputtering method, on the main surface 10A of the substrate 10.

Then, as shown in FIG. 3, a protect layer 15 made of resist was formed in a thickness of about 1 μm, on the backside surface 10B of the substrate 10. Then, as shown in FIG. 4, the substrate 10 was wet-etched by dipping it into a 40 wt %-K(OH) solution at 80° C. for two hours to remove the negative pattern 13 and thereby the thin film 14 was patterned (lifted-off). Next, the substrate 10 was anisotropy-etched to form an etch pit 16 and the thin film 14 was formed in an one side fixed beam-like shape. Then, the protect layer 15 was etched and removed by dipping the substrate 10 into a solution of methyl ethyl ketone.

Next, as shown in FIG. 5, a thermocouple 17 and a cover 18 made of Ti foil (a 50 μm thickness) were formed on the patterned thin film 14. The thus obtained assembly was set into a vacuum chamber 19, of which interior is evacuated to a pressure below $10^{-4}$ Pa by a vacuum pump (not shown).

The vacuum chamber 19 has a quartz glass-window 20, above which an infrared heater 21 is installed. The infrared heater 21 and the thermocouple 17 are connected to a thermoregulator 22 so that the thin film 14 can be heated to a determined temperature through the infrared heater 21 with the temperature of the thin film being directly monitored through the thermocouple 17. Since the cover 18 is made of Ti material which is active at a high temperature range, it can absorb the remaining oxygen during the heating and thereby prevent the thin film 14, being active at the high temperature range as well as the cover 18, from being oxidized. Moreover, it can average the heating irregularity of the infrared heater 21 and thereby the thin film 14 can be heated uniformly.

Figure 6:
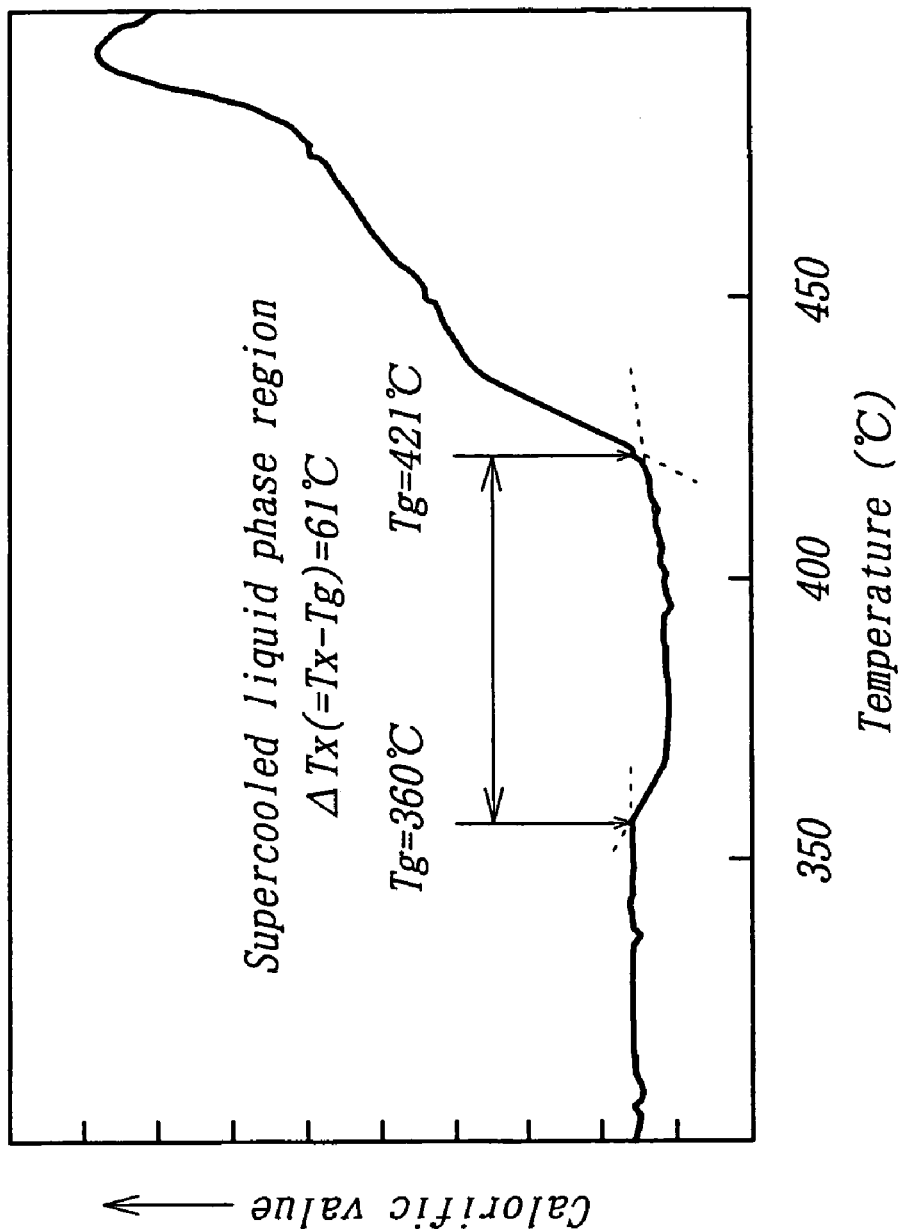
FIG. 6 is a graph showing a differential scanning calorimeter (DSC)-curve of a metallic glass of which the thin film-structure is formed.

FIG. 6 is a graph showing a differential scanning calorimeter-curve of the thin film 14 made of the metallic glass measured by a DSC to investigate its supercooled liquid phase region. As is apparent from the figure, the thin film has a glass-transition temperature (Tg) of 360° C. and a crystallization-starting temperature (Tx) of 421° C. Thus, it turns out to have its supercooled liquid phase region (ΔTx) of 61° C.

Based on the measurement of FIG. 6, the thin film 14 was heated to 387° C. at a heating rate of 10° C./min by infrared heating and held for five minutes. Thereafter, it was cooled down to room temperature at a cooling rate of 10° C./min by controlling radiation-cooling, and was taken out of the vacuum chamber 19.

Figure 7:
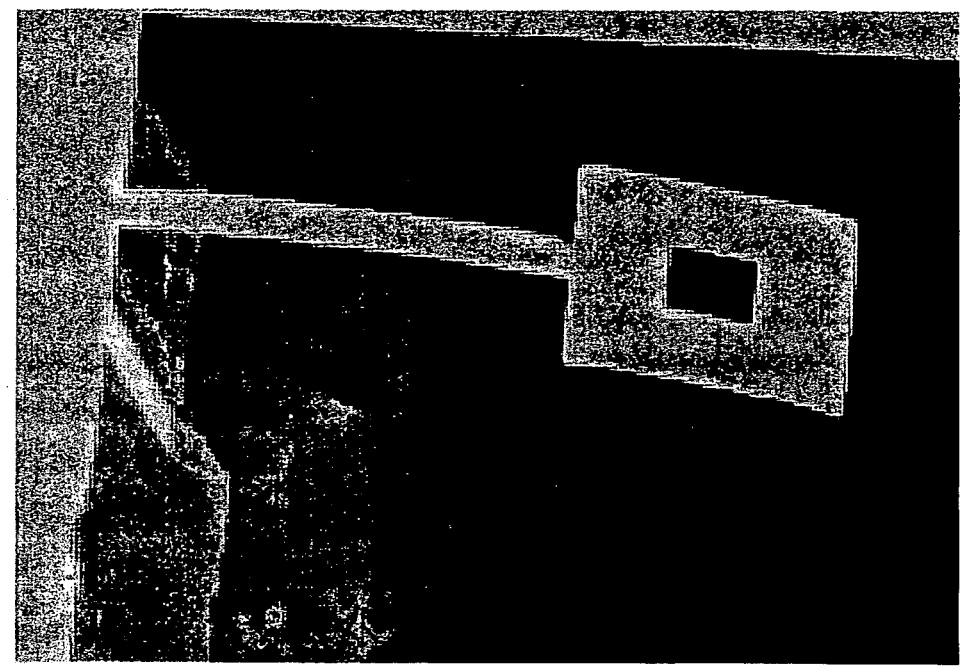
FIG. 7 is a scanning electron microscope-photograph of the thin film constituting the thin film-structure before heating the thin film to its supercooled liquid phase region.
Figure 8:
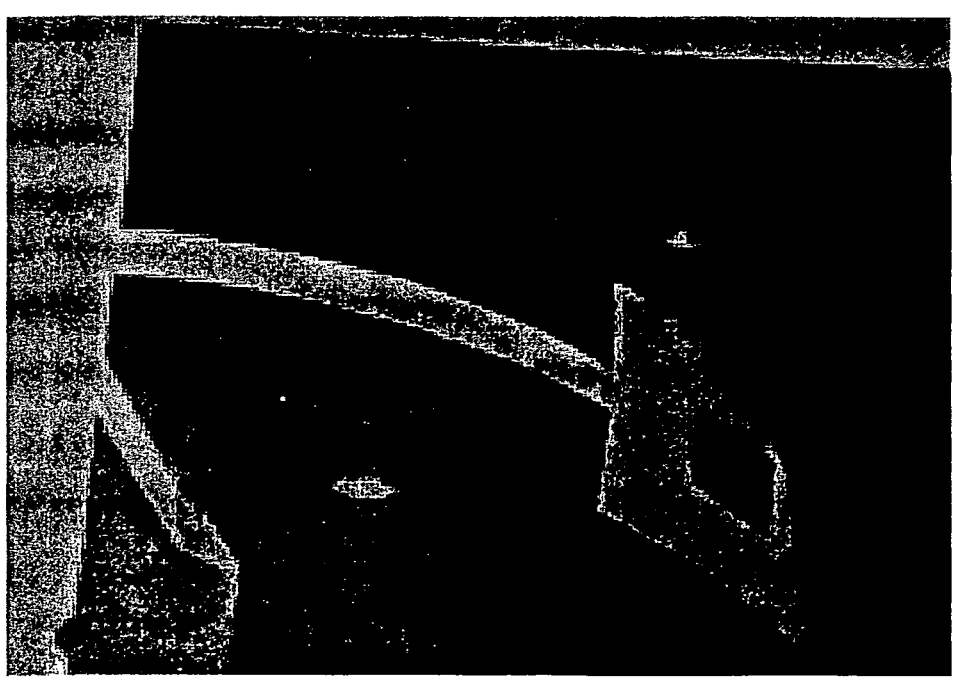
FIG. 8 is a scanning electron microscope-photograph of the thin film constituting the thin film-structure after heating the thin film to its supercooled liquid phase region.

FIGS. 7 and 8 are scanning electron microscope the condition of the thin film 14 before and after the heating.

As is apparent from FIGS. 7 and 8, a one side-fixed beam-like thin film-structure was obtained which was composed of the thin film 14 bending downward (about 150 μm) after the heating according to the present invention.

Although in this example, the thin film 14 was made of the Zr-based metallic glass, it may be of another metallic glass such as $Pd_{76}Cu_6Si_{18}$, an oxidic glass such as $SiO_2$.

Figure 10:
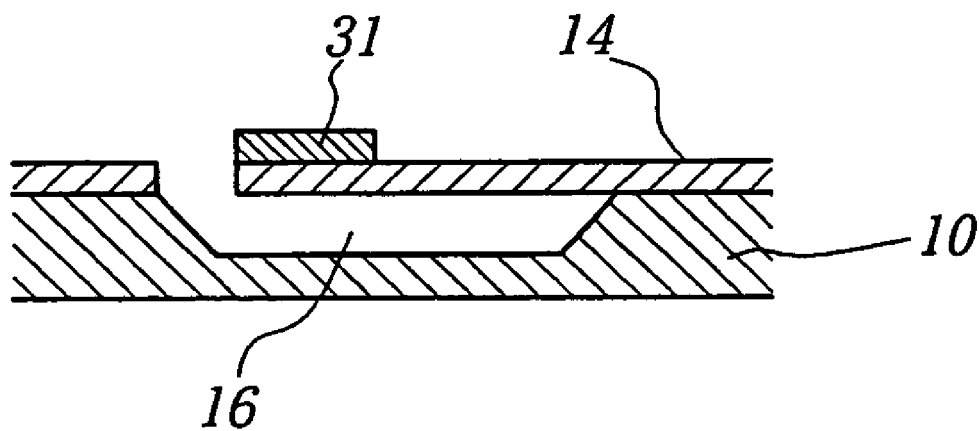
FIG. 10 is a view showing the case of forming a thick portion instead of the paddle.

Moreover, instead of the paddle 12 as shown in FIG. 1, a solder bump 30 as shown in FIG. 1 or a thick portion 31 as shown in FIG. 10, made of the same material as or the different one from the thin film may be formed on the tip of the thin film. Thereby, the thin film-structure can have a one side-fixed beam-like shape with such a thin film bending downward.

Figure 9:
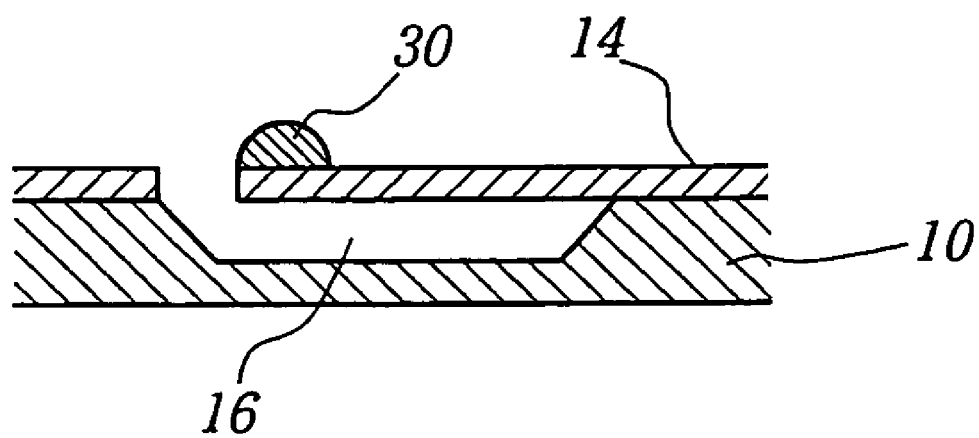
FIG. 9 is a view showing the case of forming a solder bump instead of a paddle.

In this example and the examples shown in FIGS. 9 and 10, the weight of the tip of the thin film constituting the one side-fixed beam-like thin film-structure was increased to relatively enhance its deflection degree. However, if the deflection degree is not increased, such a means is not needed to be done. Moreover, although the thin film 14 was bent toward the etch pit 16 in this example, it may be backward it by turning over the substrate.

EXAMPLE 2

In this example, the thin film made of an amorphous material having an supercooled liquid phase region was deformed by mechanical external force.

Figure 11:
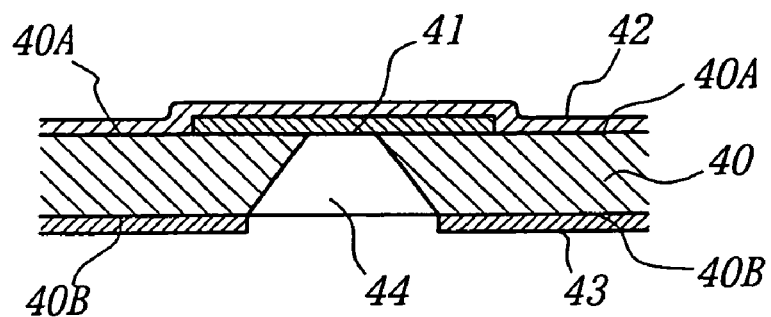
FIG. 11 is a view showing a first step in another embodiment of the method for producing the thin film-structure according to the present invention.
Figure 12:
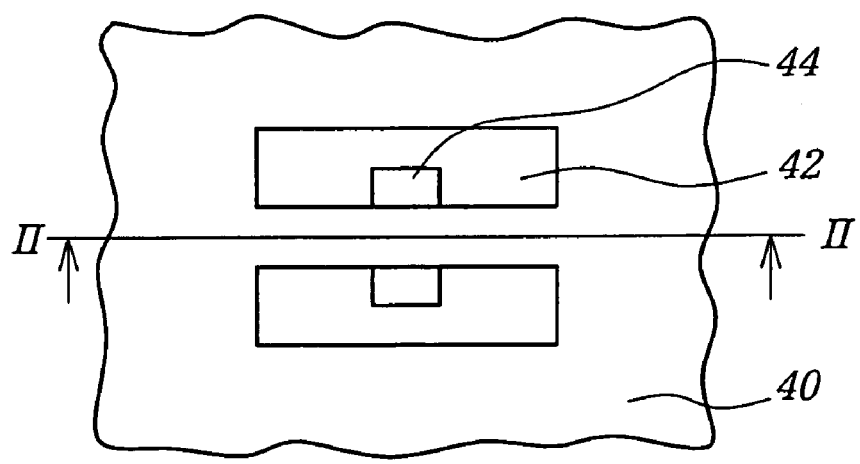
FIG. 12 is a plan view showing a step after the step of FIG. 11.
Figure 13:
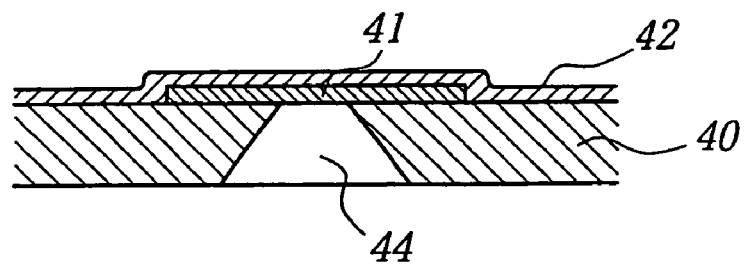
FIG. 13 is a cross sectional view taken on line II—II of FIG. 12.

FIGS. 11–15 are process chart showing a producing process of the thin film-structure of thin example. FIG. 11 is a plan view showing a first step of the producing method of the thin film-structure according to the present invention. FIGS. 12–15 are cross sectional views showing successive steps after the step of FIG. 11 with time. FIG. 13 is a cross sectional view taken on line II—II of FIG. 12.

A substrate 40 was composed of a single crystalline silicon wafer having a thickness of 200 μm and a crystal orientation <100>.

As shown in FIG. 11, a resist was spin-coated in a thickness of 1 μm on a main surface 40A of the substrate 40 and patterned by an exposing equipment to form a rectangular provisional layer 41. Then, a thin film 42 made of boron oxide ($B_2O_3$) was formed in a thickness of about 2 μm, by a CVD method, on the main surface 40A of the substrate 40 so as to cover the provisional layer 41 entirely. Next, a resist was spin-coated in a thickness of 0.5 μm on the backside surface 40B of the substrate 40 and was patterned to form a mask 43.

Then, the substrate 40 was etched by dipping it in a 40 wt %-K(OH) solution at 80° C. for 1.6 hours to form a pierced hole 44 reaching to the provisional layer 41.

Next, as shown in FIGS. 12 and 13, after a protect layer (not shown) made of resist was formed on the thin film 42, it was etched by dipping it into a buffer solution of hydrofluoric acid and thereby the thin film 42 was formed in a both side-fixed beam-like shape. Thereafter, the provisional layer 41 and the mask 43 are peeled off and removed by dipping the substrate into a solution of methyl ethyl ketone.

Figure 14:
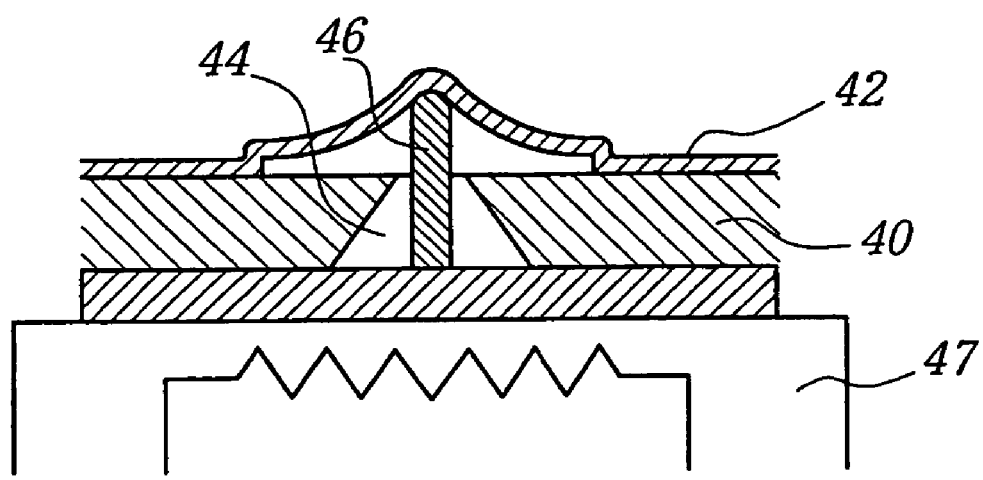
FIG. 14 is a cross sectional view showing a step after the step of FIG. 13.

Then, as shown in FIG. 14, the thus obtained assembly was set on a heating equipment 47 composed of a heater and a thermocontroller with a jig 46 made of "SUS 304" being pressed against the thin film 42 through the piercing hole 44. Next, the thin film was heated to 560° C. at a heating rate of 10° C./min and held at that temperature for two minutes. Herein, a boron oxide material of which the thin film is made had a glass-transition temperature (Tg) of 553° C.

Figure 15:
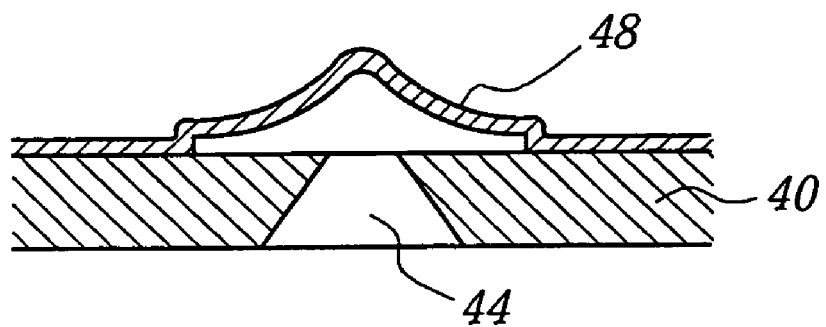
FIG. 15 is a cross sectional view showing a step after the step of FIG. 14.

Thereafter, the thin film 42 was cooled down to room temperature at a cooling rate of 10° C./min by voluntary cooling through controlling the heating degree and the heating equipment 47 and the jig 46 were taken off. Just then, as shown in FIG. 15, a three-dimensional thin film-structure 48 was obtained.

EXAMPLE 3

In this example, the thin film made of an amorphous material having an supercooled liquid phase region was deformed by electrostatic external force.

Figure 16:
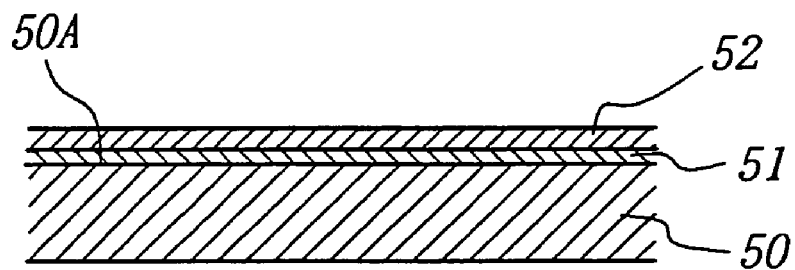
FIG. 16 is a plan view showing a first step in still another embodiment of the method for producing the thin film-structure according to the present invention.
Figure 17:
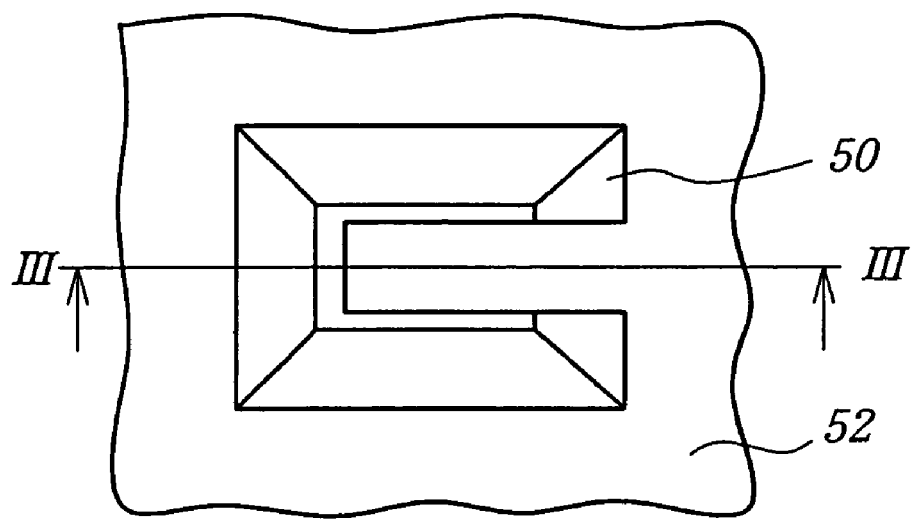
FIG. 17 is a plan view showing a step after the step of FIG. 16.
Figure 18:
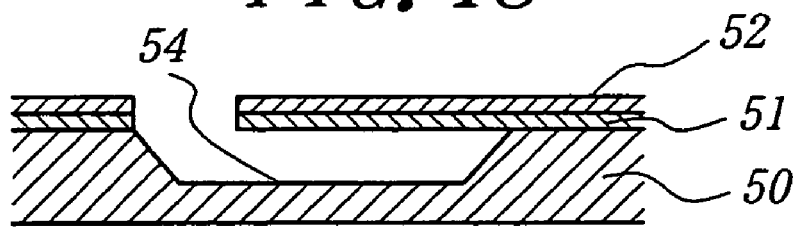
FIG. 18 is a cross sectional view taken on line III—III of FIG. 17.

FIGS. 16–20 are process chart showing a producing process of the producing method of the thin film-structure of this example. FIG. 16 is a plan view showing a first step of the producing method of the thin film-structure according to the present invention. FIGS. 17–20 are cross sectional views showing successive steps after the step of FIG. 16 with time. FIG. 18 is a cross sectional view taken on line III—III of the plan view in FIG. 17.

A substrate 50 was composed of a single crystalline silicon wafer having a thickness of 250 μm and a crystal orientation <100>.

First of all, as shown in FIG. 16, a Cr-film 51 was formed in a thickness of 50 nm, by a sputtering method, on a main surface 50A of the substrate 50. Then, a boron oxide-film 52 was formed in a thickness of about 2 μm, by a CVD method, on the Cr-film 51.

Next, as shown in FIGS. 17 and 18, a protect layer (not shown) made of resist was formed on the film 52, and thereafter the thin film 52 and the Cr-film 51 were etched by dipping them into a buffer solution of hydrofluoric acidic to pattern them.

Then, a protect layer (not shown) made of resist was formed on the backside surface 50B of the substrate 50 and thereafter the substrate 50 was etched by dipping it into a 40 wt %-K(OH) solution for two hours to form etch pit 54.

Figure 19:
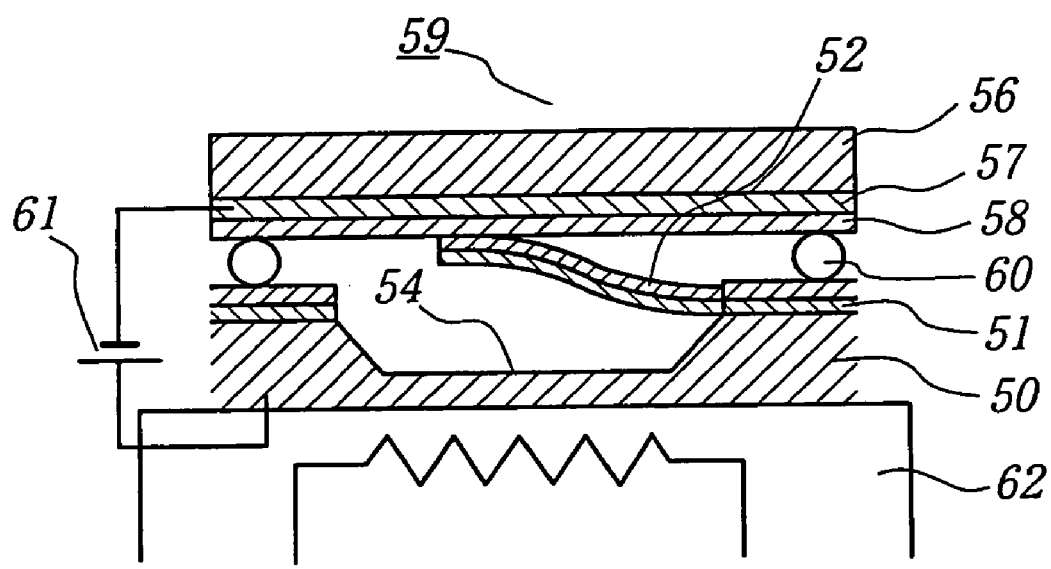
FIG. 19 is a cross sectional view showing a step after the step of FIG. 18.

Then, as shown in FIG. 19, an electrode 59 for forming was installed above the thin film 52 via glass beads 60 with a 50 μm diameter. The electrode 59 is composed of an insulated layer 58 made of silicon oxide, a Cr-electrode 57, and a quartz glass 56, which are stacked one another. Next, the substrate 50 and the electrode 59 were connected to an external electrode 61. Between the substrate 50 and the electrode 59 for forming was supplied a relatively large voltage V and was generated electrostatic force. Thereby, the thin film 52 was attracted to the electrode 59 for forming.

Then, a heater 62 was installed on the backside surface 50 of the substrate 50. The substrate 50 was heated to 560° C. at a heating rate 10° C./min and held at that temperature for two minutes. Herein, the boron oxide had a glass-transition temperature Tg of 553° C.

Figure 20:
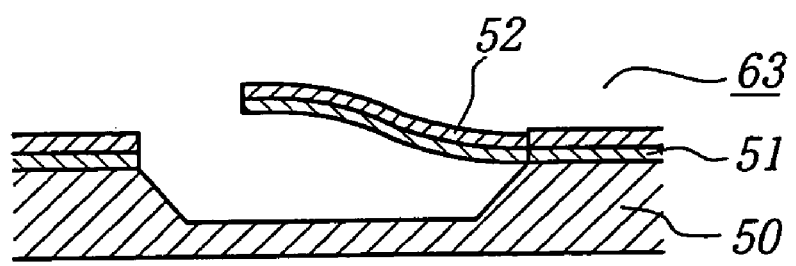
FIG. 20 is a cross sectional view showing a step after the step of FIG. 19.

Thereafter, the substrate 50 was cooled down to room temperature at a cooling rate of 10° C./min by voluntary cooling through controlling the heater 62. As a result, a thin film-structure was obtained as shown in FIG. 20.

As above mentioned, in thin example, between the substrate 50 and the electrode 59 for forming was supplied a relatively large voltage and was generated a relatively large electrostatic force. Accordingly, the thin film 52 was attracted to the electrode 59 for forming before heating it a temperature within its supercooled liquid phase region. However, when a relatively small voltage is supplied between the substrate 50 and the electrode 59 for forming, the thin film 52 is attracted to the electrode 59 to be able to form the thin film-structure 63 since it become in viscous flow by heating it to a temperature within its supercooled liquid phase region.

EXAMPLE 4

In this example, the thin film made of an amorphous material having an supercooled liquid phase region was deformed by magnetic external force.

Figure 21:
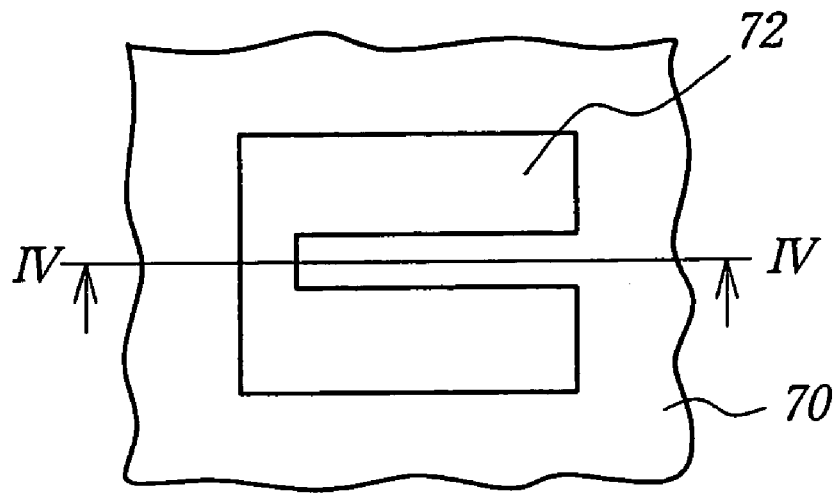
FIG. 21 is a plan view showing a first step in further embodiment of the method for producing the thin film-structure according to the present invention.
Figure 22:
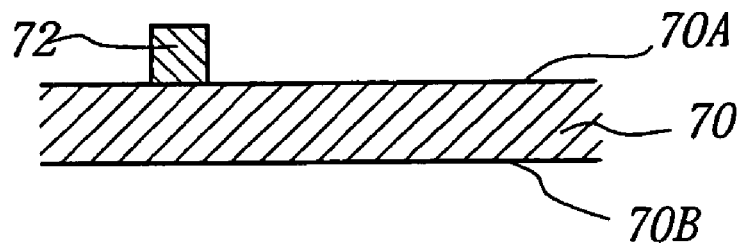
FIG. 22 is a plan view taken on line IV—IV of FIG. 21.

FIGS. 21–26 are process chart showing a producing process of the producing method of the thin film-structure of this example. FIG. 21 is a plan view showing a first step of the producing method of the thin film-structure according to the present invention. FIG. 22 is a cross sectional view taken on line IV—IV of the plan view in FIG. 21. FIGS. 23–26 are cross sectional views showing successive steps after the step of FIGS. 21 and 22 with time.

A substrate 70 was composed of a single crystalline silicon wafer having a thickness of 250 μm and a crystal orientation <100>.

First of all, as shown in FIGS. 21 and 22, a polyimide film was spin-coated in a thickness of 5 μm on a main surface 70A of the substrate 70 and was etched by RIE to form a one side-fixed negative pattern 72.

Figure 23:
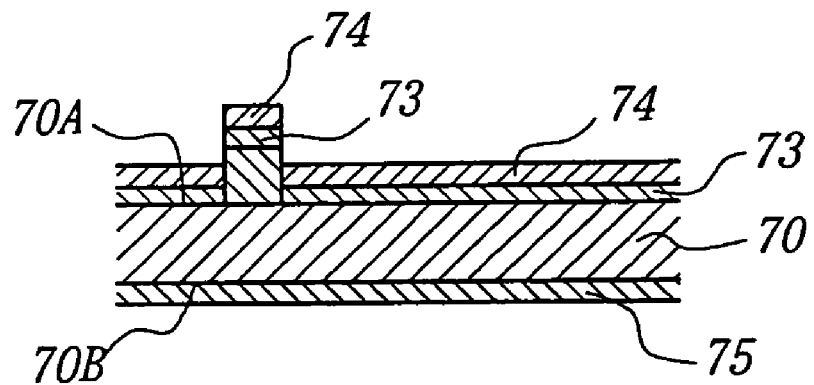
FIG. 23 is a cross sectional view showing a step after the step of FIGS. 21 and 22.

Next, as shown in FIG. 23, a thin film 73 made of metallic glass of $Pd_{61}Pt_{15}Cu_6Si_{18}$ composition was formed in a thickness of 2 μm on the main surface 70A of the substrate 70 by a sputtering method so as to cover the negative pattern 72. Then, a magnetic layer 74 made of Co material, ferromagnetic, was formed in a thickness of 0.5 μm on the thin film 73 by a sputtering method. A protect layer 75 made of resist was formed in a thickness of about 1 μm on the backside surface 70B of the substrate 70 by spin-coating.

Figure 24:
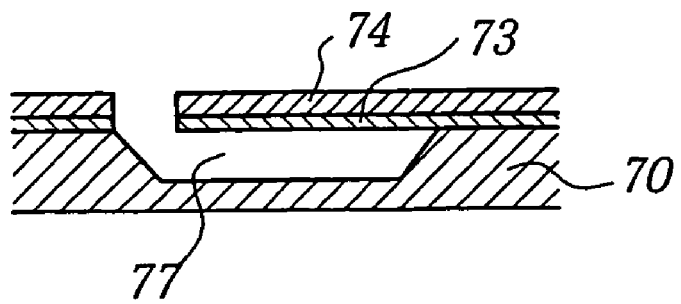
FIG. 24 is a cross sectional view showing a step after the step of FIG. 23.

Subsequently, as shown in FIG. 24, the substrate 70 was wet-etched by dipping it into a 40 wt %-K(OH) solution at 80° C. for two hours and the negative pattern 72 was removed to pattern (lift off) the thin film 73 and the magnetic layer 74. Then, the substrate 70 was anisotropy-etched to form an etch pit 77. Thereafter, the protect layer 75 was etched and removed by dipping it into a solution of methyl ethyl ketone.

Figure 25:
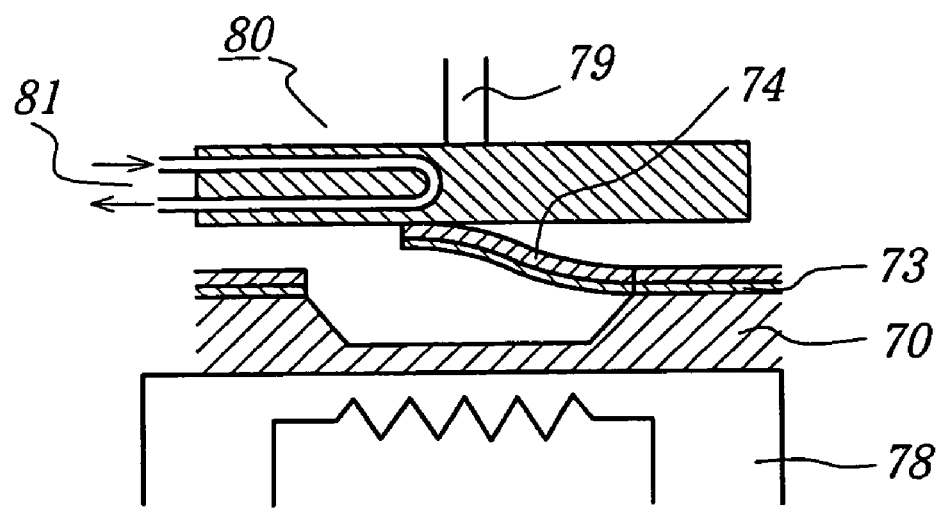
FIG. 25 is a cross sectional view showing a step after the step of FIG. 24.

Next, as shown in FIG. 25, a heater 70 was installed on the backside surface 70B of the substrate 70 and the thin film 73 was heated to 425° C. at a heating rate of 10° C./min. The metallic glass of $Pd_{61}Pt_{15}Cu_6Si_{18}$ composition had a glass-transition temperature (Tg) of 357° C.

When the thin film 73 had a temperature of 425° C., a permanent magnetic 80 joined to a shaft 79 was approached to the magnetic layer 74 by operating a vertical driving system (not shown) along the shaft 79.

In thin case, the gap between the substrate 70 and the permanent magnetic 80 is determined based on data of a displacement sensor attached to the vertical driving system. In the polarity of the permanent magnetic 80, its part in the side of the thin film 73 was N pole and the other part in the opposite side was S pole. Moreover, for protecting the permanent magnetic 80 against heat, a cooling tube 81 is provided in it.

Herein, since the Co material had a Curie Temperature of 1131° C., its ferromagnetic did not diminish as it was heated to 425° C. as above-mentioned.

When the thin film 73 was heated to the above temperature, it was soften in its supercooled liquid phase region. Thus, it was deformed as the magnetic layer 74 was attracted to the permanent magnetic.

Figure 26:
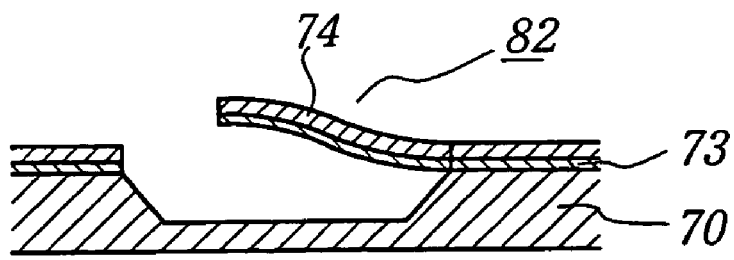
FIG. 26 is a cross sectional view showing a step after the step of FIG. 25.

When the magnetic layer 74 was, as the deformation of the thin film 73 continues, attracted to the permanent magnetic 80, the thin film 73 was cooled and its deformation stopped at a temperature not more than 357° C. Thereby, a thin film-structure 82 was obtained as shown in FIG. 26.

Herein, the magnetic layer 74 may be etched and removed by a solution of hydrochloric acid as needed after forming the thin film-structure 82.

EXAMPLE 5

In this example, the thin film made of an amorphous material having an supercooled liquid phase region was deformed by its bimorph effect.

Figure 27:
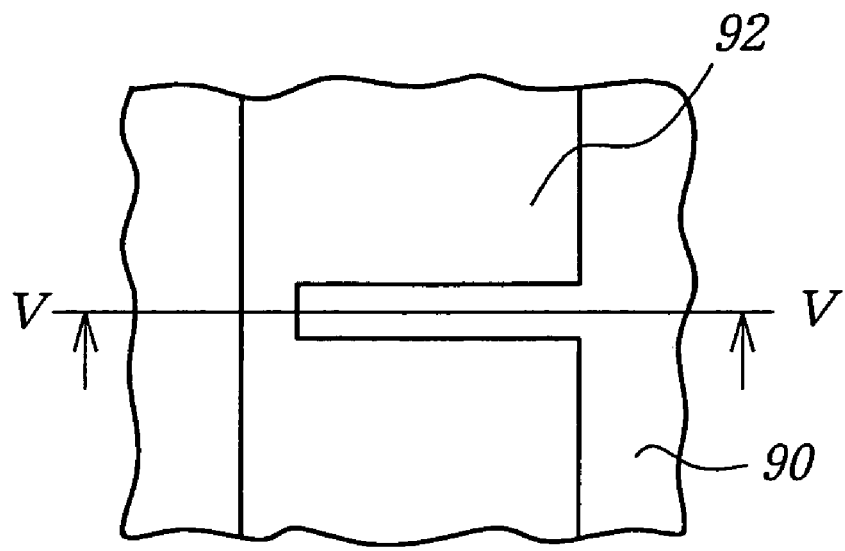
FIG. 27 is a plan view showing a first step in still further embodiment of the method for producing the thin film-structure according to the present invention.
Figure 28:
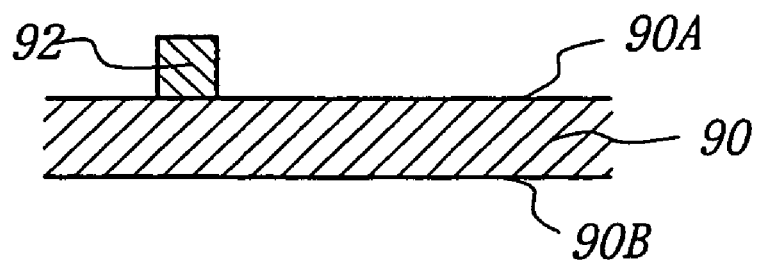
FIG. 28 is a cross sectional view taken on line V—V of FIG. 27.

FIGS. 27–32 are process chart showing a producing process of the producing method of the thin film-structure of this example. FIG. 27 is a plan view showing a first step of the producing method of the thin film-structure according to the present invention. FIG. 28 is a cross sectional view taken on line V—V of the plan view in FIG. 27. FIGS. 29–32 are cross sectional views showing successive steps after the step of FIGS. 27 and 28 with time.

A substrate 90 was composed of a single crystalline silicon wafer having a thickness of 200 μm and a crystal orientation <100>.

First of all, as shown in FIGS. 27 and 28, a polyimide film was spin-coated in a thickness of 5 μm on a main surface 90A of the substrate 90 and was etched by RIE to form a one side-fixed negative pattern 92.

Figure 29:
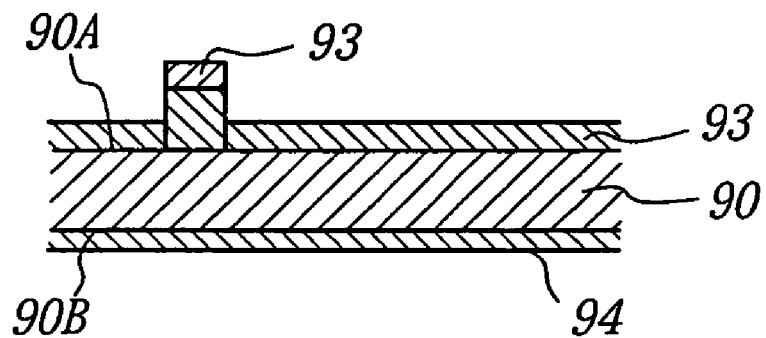
FIG. 29 is a cross sectional view showing a step after the step of FIGS. 27 and 28.

Next, as shown in FIG. 29, a thin film 93 made of metallic glass of $Pd_{61}Pt_{15}Cu_6Si_{18}$ composition was formed in a thickness of 2 μm on the main surface 90A of the substrate 90 by a sputtering method so as to cover the negative pattern 92. Moreover, a protect layer 94 was formed in a thickness of about 1 μm on the backside surface 90B of the substrate 90 by spin-coating.

Figure 30:
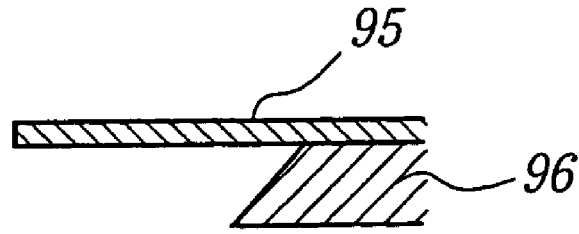
FIG. 30 is a cross sectional view showing a step after the step of FIG. 29.

Then, as shown in FIG. 30, the negative pattern 92 was wet-etched and removed by dipping it into a 40 wt %-K(OH) solution at 80° C. for three hours. As a result, the thin film 93 was patterned (lifted off) to form a one side-fixed thin film 95. Subsequently, the substrate 90 was anisotropy etched so that the base 96 of the substrate 90 can remained. Thereafter, the protect layer 94 was removed by dipping it into a solution of methyl ethyl ketone for five minutes.

Figure 31:
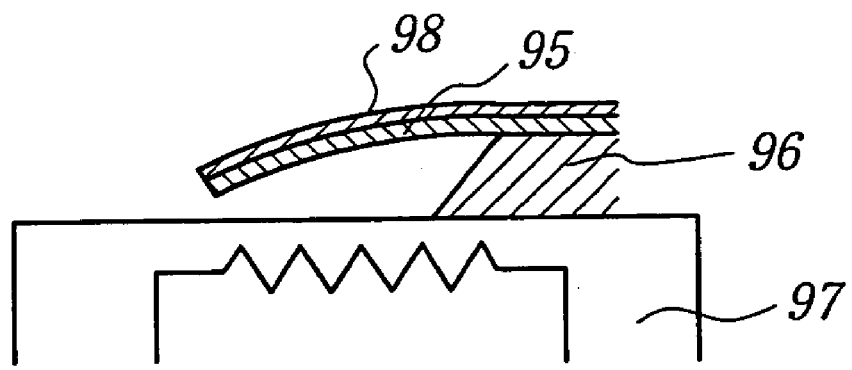
FIG. 31 is a cross sectional view showing a step after the step of FIG. 30.

Subsequently, as shown in FIG. 31, the thus obtained assembly was set in a sputtering equipment (not shown) having a heater 97. Thereafter, the interior of the sputtering equipment was evacuated to a pressure of $10^{-3}$ Pa and Ar gas was introduced into the interior so that the pressure of the interior can be 0.4 Pa.

The assembly was heated to 425° C. at a heating rate of 10° C./min and a Cr-layer 98 was formed, by a sputtering method, in a thickness of about 0.1 μm on the one side-fixed thin film 95 as the assembly was heated to a temperature over 355° C. Herein, the metallic glass of $Pd_{61}Pt_{15}Cu_6Si_{18}$ composition had a glass-transition temperature (Tg) of 357° C., as above-mentioned.

When the thin film 95 was heated to a temperature over 357° C., forces to pull down the thin film 95, resulting from the compressive stress generated in the Cr-layer 98, acted on between the thin film 95 and the Cr-layer 98. As a result, the thin film 95 hung down toward the heater 97.

The heating was stopped at the same time when the Cr-layer 98 was finished and the assembly was cooled down to room temperature at a cooling rate of 10° C./min by emission cooling through controlling the heater 97.

Figure 32:
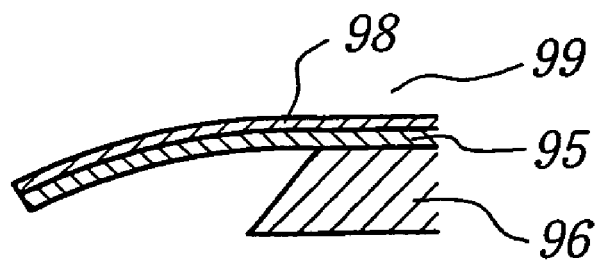
FIG. 32 is a cross sectional view showing a step after the step of FIG. 31.

When the thin film 95 was cooled down to a temperature below the supercooled liquid phase region of the metallic glass constituting the thin film 95, it stop deforming itself. Lastly, a thin film-structure 99 was obtained as shown in FIG. 32.

The Cr-layer 98 may be etched and removed by a solution of hydrochloric acid as needed after forming the thin film-structure 99.

EXAMPLE 6

In this example, the thin film made of an amorphous material having an supercooled liquid phase region was deformed by its bimorph effect. However, different from Example 5, a mixed layer was formed of a material of a substrate and the amorphous material of the thin film. Then, the bimorph effect between the mixed layer and the thin film was taken advantage of.

Figure 33:
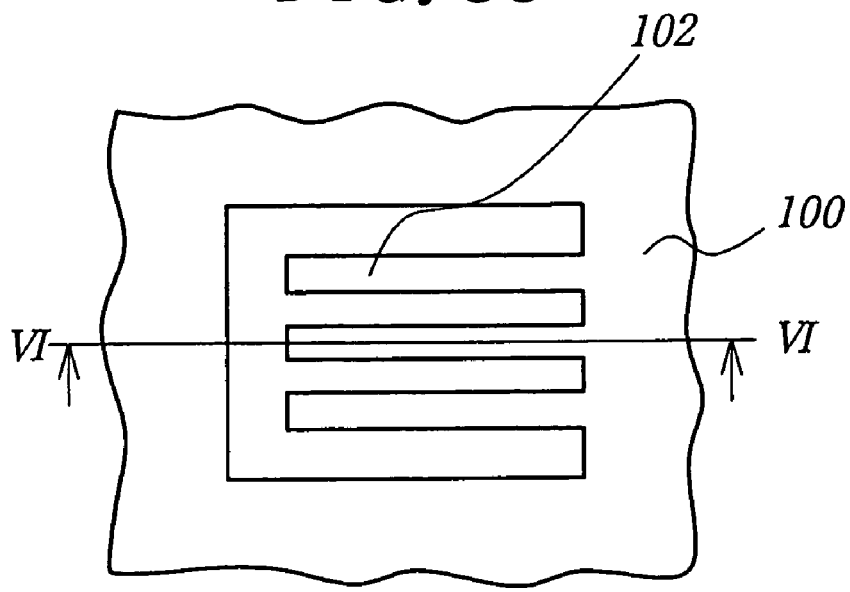
FIG. 33 is a plan view showing a first step in another embodiment of the method for producing the thin film-structure according to the present invention.
Figure 34:
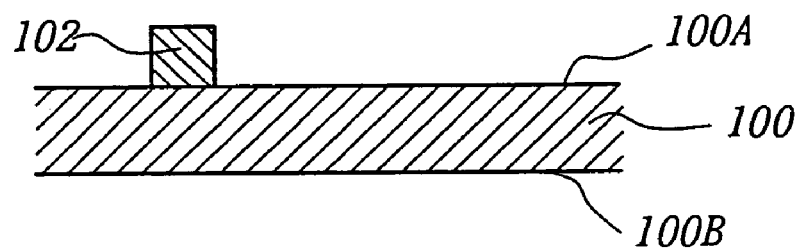
FIG. 34 is a cross sectional view taken on line VI—VI of FIG. 33.
Figure 35:
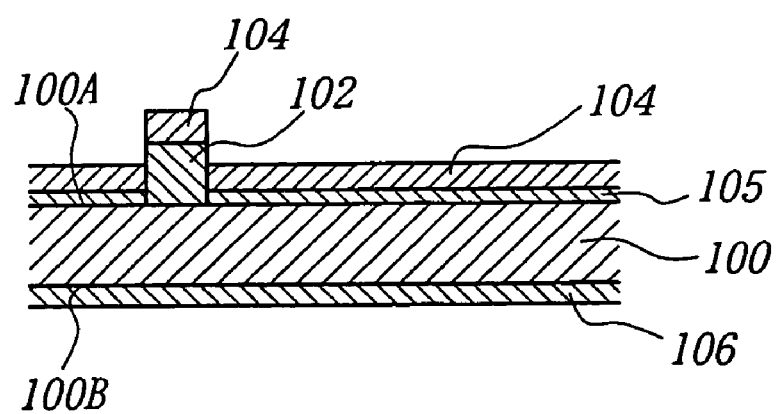
FIG. 35 is a cross sectional view showing a step after the step of FIGS. 33 and 34.
Figure 36:
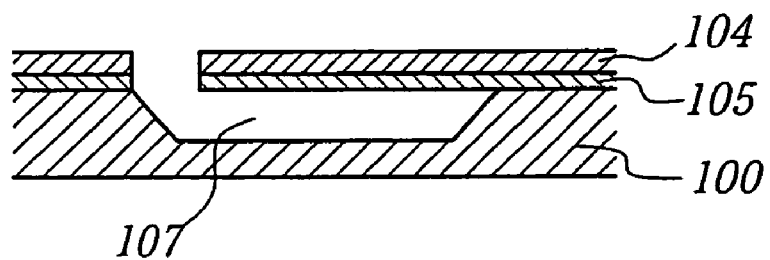
FIG. 36 is a cross sectional view showing a step after the step of FIG. 35.
Figure 37:
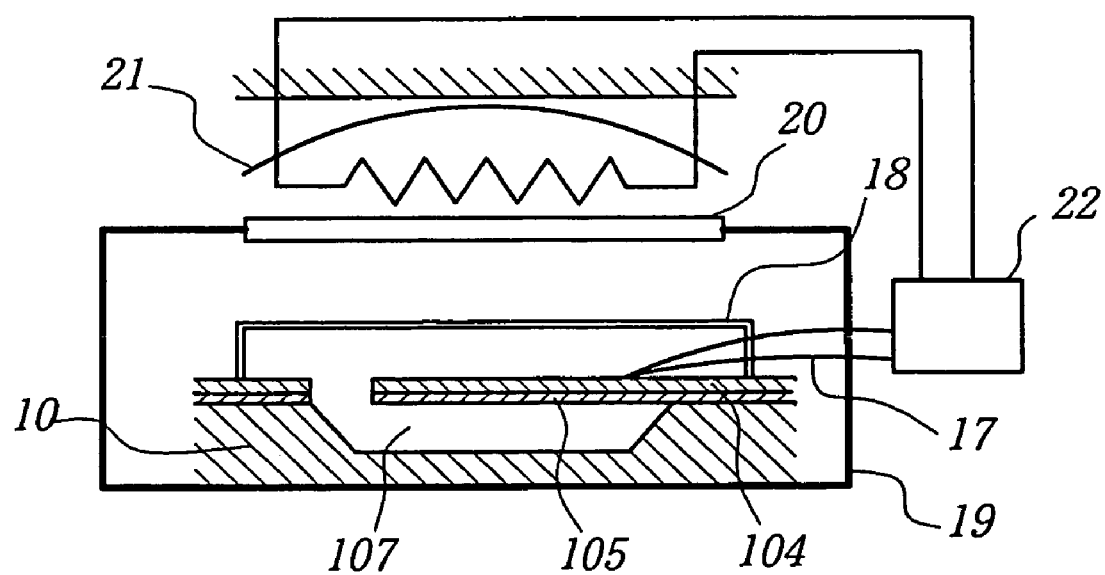
FIG. 37 is a cross sectional view showing a step after the step of FIG. 36.

FIGS. 33–37 are process chart showing a producing process of the producing method of the thin film-structure of this example. FIG. 33 is a plan view showing a first step of the producing method of the thin film-structure according to the present invention. FIG. 34 is a cross sectional view taken on line VI—VI of the plan view in FIG. 33. FIGS. 35–37 are cross sectional views showing successive steps after the step of FIGS. 33 and 34 with time.

A substrate 100 was composed of a single crystalline silicon wafer having a thickness of 200 μm and a crystal orientation <100>.

First of all, as shown in FIGS. 33 and 34, a polyimide film was spin-coated in a thickness of 5 μm on a main surface 100A of the substrate 100 and was etched by RIE to form a one side-fixed negative pattern 102.

Next, as shown in FIG. 35, a thin film 104 made of metallic glass of $Zr_{66}Cu_{33}Al_1$ composition was formed in a thickness of 2 μm on the main surface 100A of the substrate 100 by a high frequency magnetron sputtering method so as to cover the negative pattern 102. The sputtering was carried out on condition that the atmosphere pressure was 0.03 Pa and the sputtering output power was 150W, resulting in the main surface 100A of the substrate 100 being counter-sputtered by the elements constituting the thin film 104. As a result, a mixed layer 105, in which the particles of the metallic glass and the silicon particles of the substrate were mixed, was formed in a thickness of about 20 nm.

Moreover, a protect layer 106 was formed in a thickness of about 1 μm on the backside surface 100B of the substrate 100 by spin-coating.

Then, as shown in FIG. 36, the negative pattern 102 was wet-etched and removed by dipping it into a 40 wt %-K(OH) solution at 80° C. for two hours. Subsequently, the thin film 104 and the mixed layer 105 were patterned (lifted off) and the substrate 100 was anisotropy-etched to form an etch pit 107. Thereafter, the protect layer 106 was removed by dipping the substrate 100 entirely into a solution of methyl ethyl ketone for five minutes.

Subsequently, as shown in FIG. 37, the thermocouple 17 and the cover 18 made of Ti foil (a 50 μm thickness) were installed above the thin film 104 as in FIG. 5, and the thus obtained assembly was set in the vacuum chamber 19. Thereafter, the thin film 104 was heated to 660° C. at a heating rate of 10° C./min by the infrared heater 21.

Just then, the stress, resulting from the difference in thermal expansion coefficient between the mixed layer 105 and the thin film 104, occurred in their interface. The thermal expansion coefficient of the mixed layer 105 was smaller than that of the thin film 104, so that the thin film 104 had the compressive stress from the mixed layer 105 and was deformed downward.

Figure 38:
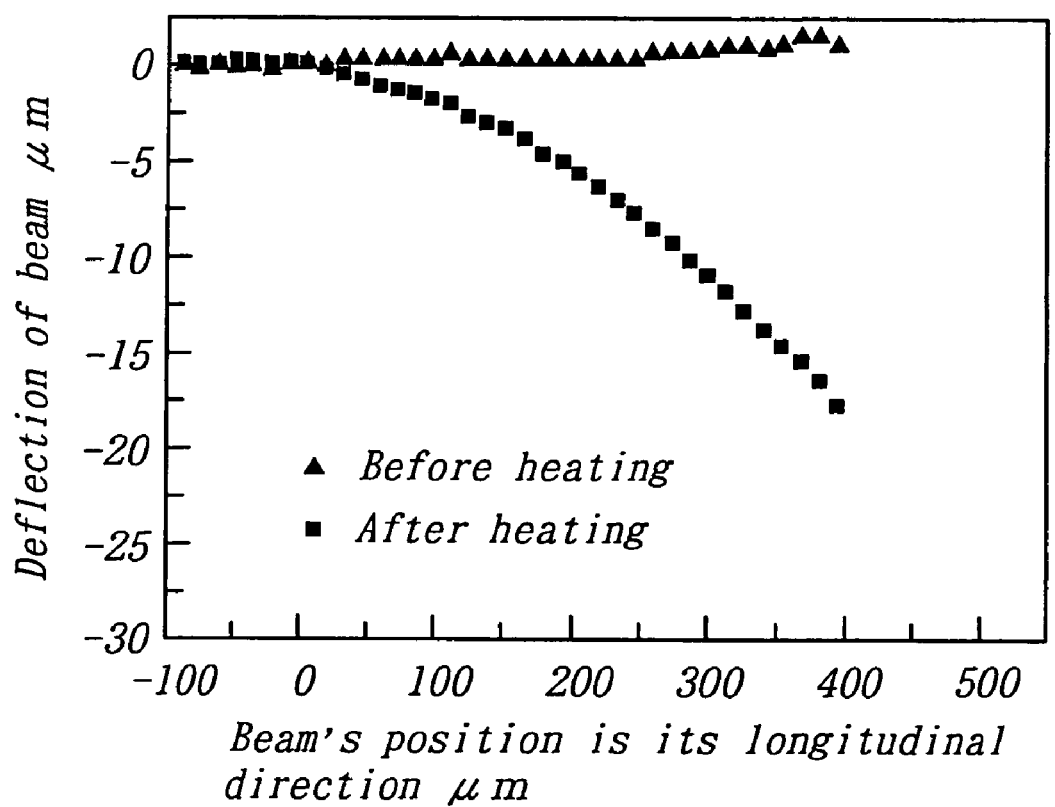
FIG. 38 is a graph showing deflection degree of the thin film constituting the thin film-structure of the present invention before and after heating it to its supercooled liquid phase region.

FIG. 38 shows a deflection degree of the thin film 104 before and after heating it.

As is apparent from FIG. 38, the thin film 104 is largely bent by the bimorph effect after heating though it is not deformed before heating. Consequently, it was confirmed that the one side-fixed beam-like thin film structure can be formed according to the present invention.

Although the present invention was described in detail with reference to the above examples, this invention is not limited to the above disclosure and every kind of variation and modification may be made without departing from the scope of the present invention.

The thin film-structure is formed of an amorphous material having an supercooled liquid phase region and takes advantage of the specific natures of the amorphous material below and within the supercooled liquid phase region. Thus, the thin film-structure having excellent shape-stability after its formation can be obtained under good productivity and good reproducibility.

What is claimed is:

1. A thin film-structure composed of a three-dimensional deformed thin film made of an amorphous material having a supercooled liquid phase region and a glass transition temperature within 250–400° C., wherein said amorphous material has a viscous flow within a viscosity range of $10^{11}$–$10^{13}$ Pa·S so that said three-dimensional deformed thin film can be formed by its weight.

2. The thin film-structure as defined in claim 1, wherein said amorphous material has a temperature width of not less than 20° C. in said supercooled liquid phase region.

3. The thin film-structure as defined in claim 1, wherein said amorphous material is an oxide glass.

4. The thin film-structure as defined in claim 1, wherein said amorphous material is a chalcogenide semiconductor metallic glass.

5. The thin film-structure as defined in claim 1, wherein said amorphous material is an amorphous alloy except LaAlNi based amorphous alloy.

* * * * *